United States Patent [19]

Nemoto et al.

[11] Patent Number: 5,565,380

[45] Date of Patent: Oct. 15, 1996

[54] SEMICONDUCTOR DEVICE AND PROCESS FOR PRODUCTION THEREOF

[75] Inventors: Takenao Nemoto; Takeshi Nogami; Naoki Matsukawa, all of Chiba, Japan

[73] Assignee: Kawasaki Steel Corporation, Kobe, Japan

[21] Appl. No.: 172,716

[22] Filed: Dec. 27, 1993

[30] Foreign Application Priority Data

| Dec. 28, 1992 | [JP] | Japan | 4-349382 |
| Jan. 11, 1993 | [JP] | Japan | 5-002836 |
| Mar. 26, 1993 | [JP] | Japan | 5-068690 |

[51] Int. Cl.$^6$ ............................................. H01L 21/44
[52] U.S. Cl. .......................... 437/198; 437/187; 437/196; 437/197; 437/199
[58] Field of Search ........................................ 437/198, 197, 437/196, 187, 188, 199, 209

[56] References Cited

U.S. PATENT DOCUMENTS

| 3,725,309 | 4/1973 | Ames et al. . | |
| 4,249,957 | 2/1981 | Koliwad et al. . | |
| 4,495,221 | 1/1985 | Broadbent . | |
| 4,837,183 | 6/1989 | Polito et al. | 437/198 |
| 5,091,770 | 2/1992 | Yamaguchi | 437/209 |
| 5,238,874 | 8/1993 | Yamada | 437/198 |
| 5,300,307 | 4/1994 | Freard et al. | 437/198 |

FOREIGN PATENT DOCUMENTS

0425162A2  5/1991  European Pat. Off. .

OTHER PUBLICATIONS

D. R. Frear et al., "The Evolution of Microstructure in Al–2 Pct Cu Thin Films: Precipitation, Dissolution, and Reprecipitation," Metallurgical Transactions A, vol. 21A, Sep. 1990, pp. 2449–2458.

T. Nemoto et al., "Segregation of Cu to Grain Boundaries by Aging Treatment and its Effects on EM Resistance for AlCu/TiN Lines," LSI Research Center, Kawasaki Steel Corporation, publication date unknown.

D. Weston et al., "Microcorrosion of Al—Cu and Al—Cu—Si alloys: Interaction of the metallization with subsequent aqueous photolithographic processing," J. Vac. Sci. Technol. A, vol. 8 No. 3, May/Jun. 1990, pp. 2025–2032.

C. Kim et al., "The influence of Cu precipitation of electromigration failure in Al—Cu—Si," J. Appl. Phys., vol. 72, No. 5, Sep. 1, 1992, pp. 1837–1845.

"Patent Abstracts of Japan", JP–A–62 240 733, Apr. 13, 1988, vol. 12, No. 117, p. 114, C 487.

"Patent Abstracts of Japan", JP–A–62 240 734, Apr. 13, 1988, vol. 12, No. 117, p. 114, C 487.

"Patent Abstracts of Japan", JP–A–62 240 735, Apr. 13, 1988, vol. 12, No. 117, p. 115 C 487.

"Patent Abstracts of Japan", JP–A–62 240 736, Apr. 13, 1988, vol. 12, No. 117, p. 115 C 487.

"Patent Abstracts of Japan", JP–A–62 240 737, Apr. 13, 1988, vol. 12, No. 117, p. 115 C 487.

"Patent Abstracts of Japan", JP–A–62 240 738, Apr. 13, 1988, vol. 12, No. 117, p. 116 C 487.

"Patent Abstracts of Japan", JP–A–62 240 739, Apr. 13, 1988, vol. 12, No. 117, p. 116 C 487.

Primary Examiner—Kevin M. Picardat
Attorney, Agent, or Firm—Oliff & Berridge

[57] ABSTRACT

A semiconductor device having an interconnecting line formed of aluminum containing a predetermined additive element, wherein a segregate layer of the additive element is formed along aluminum grain boundaries in the interconnecting line on the basis of a heat treatment after the formation of the interconnecting line.

10 Claims, 15 Drawing Sheets

| AGING HEAT TREATMENT | ELECTROMIGRATION CUMULATIVE FAILURE (10%) | STATE OF PRECIPITATE OF Cu OR Aℓ — Cu ALLOY |
|---|---|---|
| NONE | 250 HR. | DISPERSION IN Aℓ GAIN |
| 200°C | 550 HR. | LAYER (OR FILM) — LIKE SEGREGATE AT Aℓ GRAIN BOUNDARY |
| 250°C | 650 HR. | LAYER (OR FILM) — LIKE SEGREGATE AT Aℓ GRAIN BOUNDARY |
| 300°C | 20 HR. | CLUSTER —LIKE PRECIPITATE AT TRIPLE POINT OF Aℓ GRAIN BOUNDARY AND IN GRAIN |

FIG.6

| AGING TEMP. | TIME TO 10% FAILURE (HR) |
|---|---|
| ROOM TEMP. | 100 |
| 200°C | 200 |
| 250°C | 260 |
| 280°C | 200 |
| 290°C | 100 |
| 300°C | 16 |

FIG.7

FIG. 13  1 μm

F I G. 15

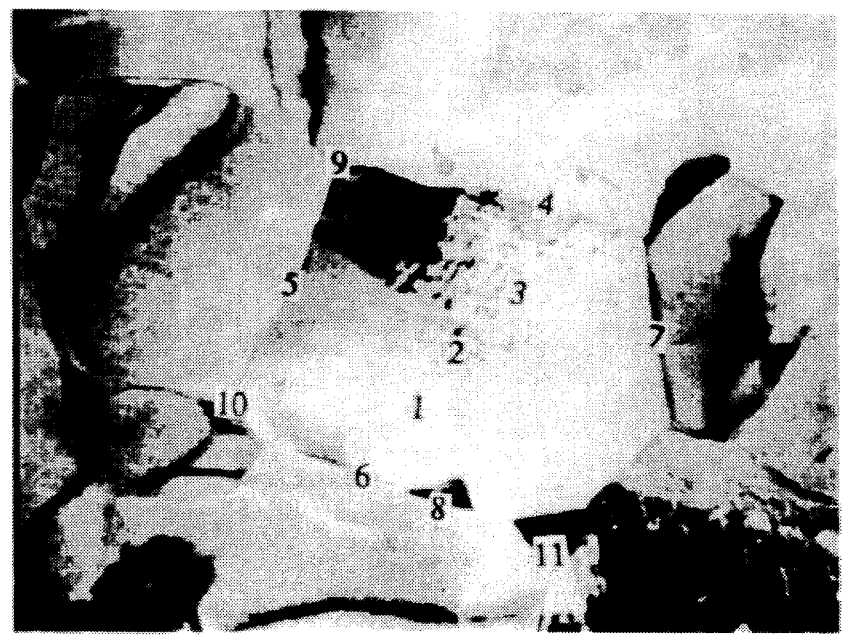
F I G. 16

SEMICONDUCTOR DEVICE AND PROCESS FOR PRODUCTION THEREOF

BACKGROUND OF THE INVENTION

1. Field of the Invention

The present invention relates to a semiconductor device such as IC and LSI, and particularly to a semiconductor device having lines (or interconnecting lines or wiring) which may reduce electromigration or/and stress migration. The present invention also relates to a process for producing a semiconductor device such as IC and LSI, particularly to a process for forming lines in a semiconductor device.

2. Related Background Art

In semiconductor devices, a deposited film (i.e., a film formed by sputtering or by vapor deposition) of aluminum (Al) is popularly used as a metal film for forming lines or wiring, because it has synthetically many advantages such as conductivity, ohmic contact property to silicon (Si), wire bonding property and processability. In a case where an aluminum wiring film is formed on a silicon substrate by use of a vapor deposition technique, the resultant wiring film generally has a polycrystal structure of aluminum grains. For example, as shown in a schematic view of FIG. 18, the above polycrystal structure comprises an aggregate of aluminum single crystal grains 1 wherein grain boundaries 2 are present among aluminum single crystal grains 1, and the wiring layer is imparted with conductivity on the basis of such a structure.

However, the deposited film as described above has a specific problem which is different from those encountered in wiring films generally used. More specifically, the deposited film has such a problem that disconnection or failure of line is liable to occur due to electromigration or/and stress migration. Accordingly, it is important to reduce the electromigration or/and stress migration in order to increase the lifetime of a semiconductor device.

The electromigration is a sort of diffusion phenomenon based on an interaction between metal atoms in a metal wiring film and electrons moving in the wiring film. More specifically, the electromigration is a phenomenon such that the metal atoms migrate in the same direction as that of the electron movement, and the resultant metal atom migration causes an atomic vacancy or void to be formed at a place from which the metal atoms have moved, or causes a hillock to be built up at a place where the metal atom accumulate, as shown in the enlarged view in FIG. 18. When the above void is formed as described above, a cross sectional area of the metal wiring film is decreased and consequently the current density in the metal wiring film is increased, whereby the temperature rises by Joule heat and the growth of void is further accelerated to invite disconnection of the line. On the other hand, the extension of the hillock as described above may result in a trouble of short circuit between proximate lines in a highly integrated circuit.

Further, although the mechanism of the stress migration phenomenon as described above is not completely clarified, it is considered that disconnection is caused on the basis of mechanical stress exerted onto the aluminum single crystal grains 1 shown in FIG. 18.

Hitherto, in order to improve an electromigration resistance of the wiring metal in a semiconductor integrated circuit, an Al-Cu alloy, in which Cu is added to Al, is used as a wiring material.

However, when the Al-Cu type alloy is used as a wiring material, there has been a problem that a sufficient resistance to electromigration cannot be obtained due to thermal hysteresis (or thermal history) in the wiring metal.

On the other hand, it is reported that the lifetime of the line can be improved by an isothermal storage treatment at 226° C. for 24 hours after the formation of unpassivated line of an Al-2% Cu-1% Si alloy thin film (see "J. Appl. Phys. 72(5), p. 1837, Sep. 1, 1992"). However, in the case of the line of an alloy thin film having a relatively high Si content and containing a relatively large amount of Cu as described above, there is posed a serious problem of corrosion, as the line or interconnecting pattern is made finer (see "J. Vac. Sci. Technol. A, Vol. 8, No. 3, p. 2025, May/June 1990").

More specifically, it is known that rapid heating and rapid cooling leaves thermal hysteresis in a wiring metal, because a metal thin film deposition technique by sputtering is generally used for forming the wiring. Further, since an alloying step is conducted at about 400° C. in a final step for producing a semiconductor integrated circuit, the thermal hysteresis is also imparted to the wiring metal due to rapid heating and rapid cooling. However, in the prior art, it is difficult to improve the resistance of the wiring metal to electromigration.

SUMMARY OF THE INVENTION

An object of the present invention is to provide a semiconductor device having a line (or a wiring film) which is capable of reducing electromigration or/and stress migration.

Another object of the present invention is to provide a process for producing a semiconductor device, which is capable of improving the resistance of an Al alloy line to electromigration.

According to the present inventors' findings, in the prior art, because of the thermal steps by rapid heating and rapid cooling, the segregation of an Al-Cu alloy is not sufficient in grain boundaries in the wiring metal, whereby it is difficult to improve the resistance of the wiring metal to electromigration.

The present invention is based on the above discovery. More specifically, the process for producing a semiconductor device according to the present invention comprises the steps of:

forming an interconnecting line of an Al alloy thin film containing a predetermined amount of an additive element; and subjecting the interconnecting line to a heat treatment so as to segregate the additive element in the interconnecting line.

The present invention also provides a process for producing a semiconductor device, comprising:

forming an interconnecting line of an Al alloy thin film containing a predetermined amount of an additive element in a semiconductor chip;

mounting the semiconductor chip in a package; and subjecting the interconnecting line of the semiconductor chip mounted in the package to a heat treatment so as to segregate the additive element in the interconnecting line.

The present invention further provides a semiconductor device having an interconnecting line of aluminum containing a predetermined additive element, wherein a segregate layer of the additive element is formed along aluminum grain boundaries in the interconnecting line on the basis of a heat treatment after the formation of the interconnecting line.

The present invention further provides a semiconductor device, comprising:

a package;

a semiconductor chip mounted in the package; and an interconnecting line formed in the semiconductor chip by vapor deposition of aluminum containing a predetermined additive element, wherein a segregate layer of the additive element is formed along aluminum grain boundaries in the interconnecting line on the basis of a heat treatment after the formation of the interconnecting line and the mounting of the semiconductor chip in the package.

According to the present inventors' findings, in the semiconductor device according to the present invention having the above-described wiring structure, the layer of the additive element segregated along the aluminum grain boundaries functions to reduce vibration and diffusion of aluminum grains. As a result, the electromigration and stress migration may be reduced, thereby to provide a semiconductor device improved in lifetime and reliability.

Further, according to the present inventors' findings, in the above-described process according to the present invention, since the heat treatment to segregate the additive element (such as Cu) is performed after the formation of lines of Al alloy thin film, the additive element or Al alloy containing the additive element may be sufficiently segregated. As a result, the resistance of the lines to electromigration may be improved.

Furthermore, in the present invention, even when the amount of the additive element (such as Cu) to be added to Al for the purpose of preventing the electromigration is small to some extent, it is generally sufficient for prevention of the electromigration, whereby substantially no corrosion occurs even in fine interconnecting lines.

The interconnecting lines to be used in the production process according to the present invention may preferably contain substantially no Si. When the lines contain substantially no Si, Si having an electrical conductivity smaller than that of Al is prevented from preliminarily segregating or precipitating in the aluminum boundaries during the heat treatment for segregating the additive element, and therefore the cross sectional area of the lines is not substantially reduced and the current density is not increased locally. As a result, the electromigration resistance of the lines may be improved.

Further, the interconnecting lines to be used in the production process according to the present invention may preferably contain Si in an amount which is not more than a solid solubility (or solid solution limit, solvus) of Si to Al at a temperature at which the heat treatment in the production process is to be conducted. The term "solid solubility" used herein refers to a curve on a temperature composition diagram (e.g., FIG. 11 as described hereinafter) indicating the limits of solubility of one solid phase in another. When the amount of Si contained in the lines is not more than the solid solubility, Si does not segregate or precipitate in the Al grain boundaries during the heat treatment for segregation of the additive element. As a result, the electromigration resistance of lines may further be improved.

The temperature for the heat treatment in the production process according to the present invention may preferably be in the range of from 200° C. to 290° C. When the temperature for the heat treatment is in such a range, the additive element such as Cu may segregate so as to provide good distribution thereof and the electromigration resistance of the lines may further be improved.

In a case where no Si is contained in the lines to be used in the production process according to the present invention, it is possible that an Al spike is liable to be formed at a position where an interconnecting line is in contact with a substrate (such as silicon substrate) for forming the semiconductor device. However, even when such a problem is posed, it may be solved by using Ti or another metal for a ground layer which is to be disposed under an Al layer and constitutes an interconnecting line together with the Al layer. Such a ground layer may preferably comprise a metal or metal compound having a high-melting point, such as TiN, W-Si, Ti-W, Ti-W-N, TiON, W, Mo and Mo-Si.

Further, in a case where packaging is conducted after the formation of a semiconductor device chip, when a rapid heating step of about 400° C. and a rapid cooling step are effected, it is preferred to subject the semiconductor chip mounted to a package to a heat treatment so as to segregate the additive element. When such a heat treatment is conducted, it is possible to prevent the once-segregated or once-precipitated Al alloy (such as Al-Cu alloy) from again being incorporated or confined in the crystal grains, even when the rapid heating and the rapid cooling are conducted at the time of the packaging.

Further objects and advantages of the present invention will be apparent from the description of the preferred embodiments with the accompanying drawings.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 6 is a table showing experimental results obtained by measuring electromigration resistance of interconnecting lines while changing an aging temperature.

FIG. 7 is another table showing experimental results obtained by measuring electromigration resistance of interconnecting lines while changing an aging temperature.

FIG. 13 is a photograph of a typical part of a non-aged Al-Cu alloy.

FIG. 15 is a photograph of a typical part of a 100 hour-aged Al-Cu alloy.

FIG. 16 is a photograph showing an example for TEM map from which EDX signals are to be detected.

FIG. 17A shows a state of Cu-Al alloy before aging, FIG. 17B shows a state of Cu-Al alloy after 10 hour-aging, and FIG. 17C shows a state of Cu-Al alloy after 50 hour-aging.

DESCRIPTION OF THE PREFERRED EMBODIMENTS

Hereinbelow, preferred embodiments of the present invention will be explained with reference to the accompanying drawings.

Figure 1:
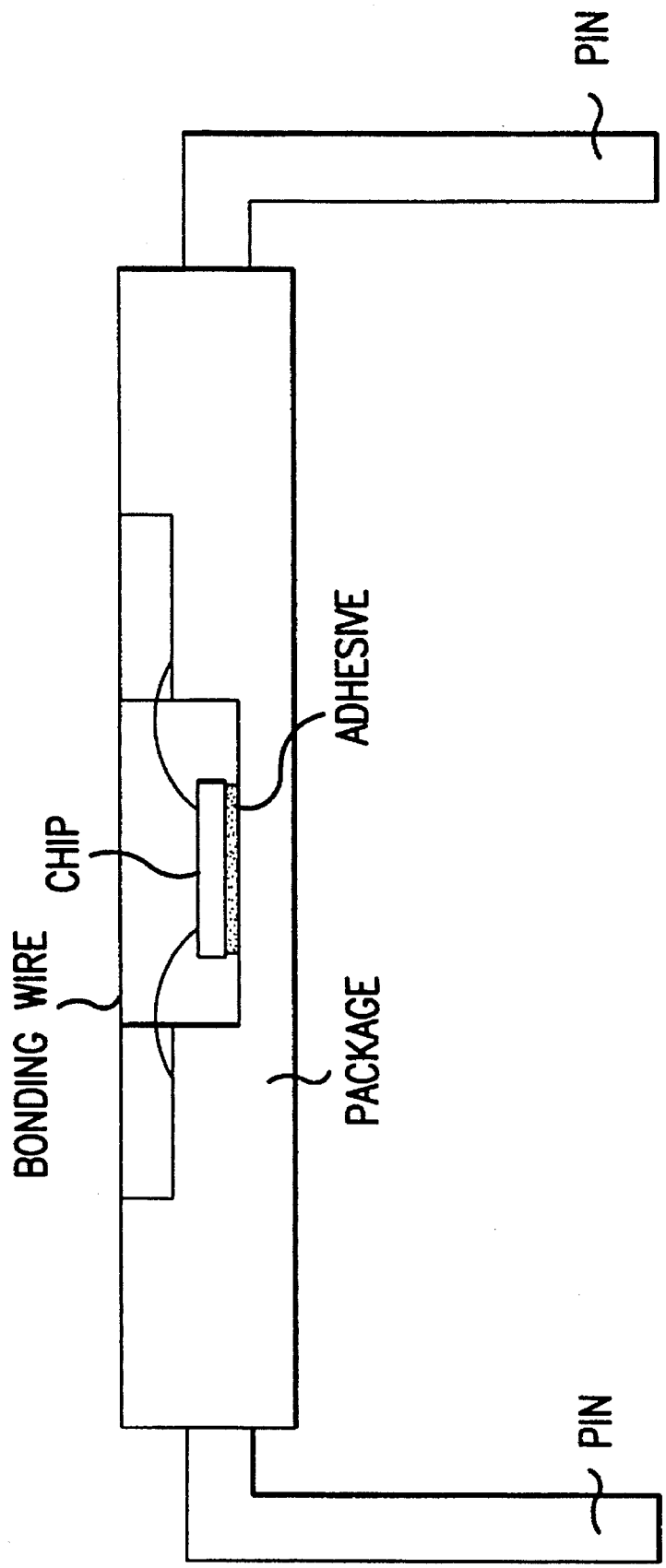
FIG. 1 is a schematic cross sectional view showing an embodiment of the semiconductor device (after packaging) according to the present invention.

FIG. 1 is a schematic cross sectional view showing an embodiment of the semiconductor device (after packaging) according to the present invention. Referring to FIG. 1, a chip of semiconductor device is mounted in a DIP (dual inline package) type package such as hermetic ceramic package. The chip is glued to the package with an adhesive. Pins (terminal leads) of the package are connected to internal electrodes (not shown) on the chip with bonding wires.

Figure 2:
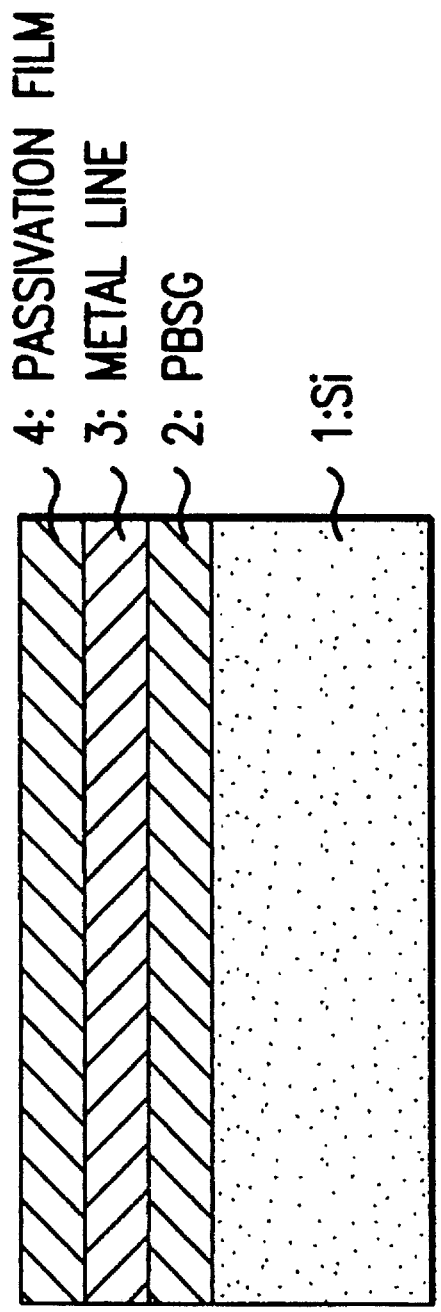
FIG. 2 is a schematic cross sectional view showing another embodiment of the semiconductor device according to the present invention.

FIG. 2 is a schematic cross sectional view showing an embodiment (integrated circuit; IC) of the semiconductor device according to the present invention. Referring to FIG. 2, a thin boron-containing phospho-silicate glass (BPSG) film 2 is disposed on a silicon substrate 1, a metal interconnecting line 3 is disposed on the boron-containing phospho-silicate glass (BPSG) film 2, and a passivation film 4 is disposed on the metal line 3 so as to cover the metal line 3.

In the embodiment of FIG. 2, the respective layers may preferably have the following thickness.

BPSG film 2: 3,000 Å–20,000 Å (2 μm) (more preferably 3000 Å–12,000 Å)

Al alloy layer 3: 3,000 Å–12,000 Å (more preferably 5,000 Å–10,000 Å)

Ground layer *: 500 Å–2,000 Å (more preferably 800 Å–1,500 Å)

Passivation film 4: 5,000 Å–20,000 Å (2 μm) (more preferably 6,000 Å–14,000 Å)

(*: not shown in FIG. 2; a layer which is disposed under the Al alloy layer 3 and constitutes an interconnecting line together with the Al alloy layer 3).

Figure 3:
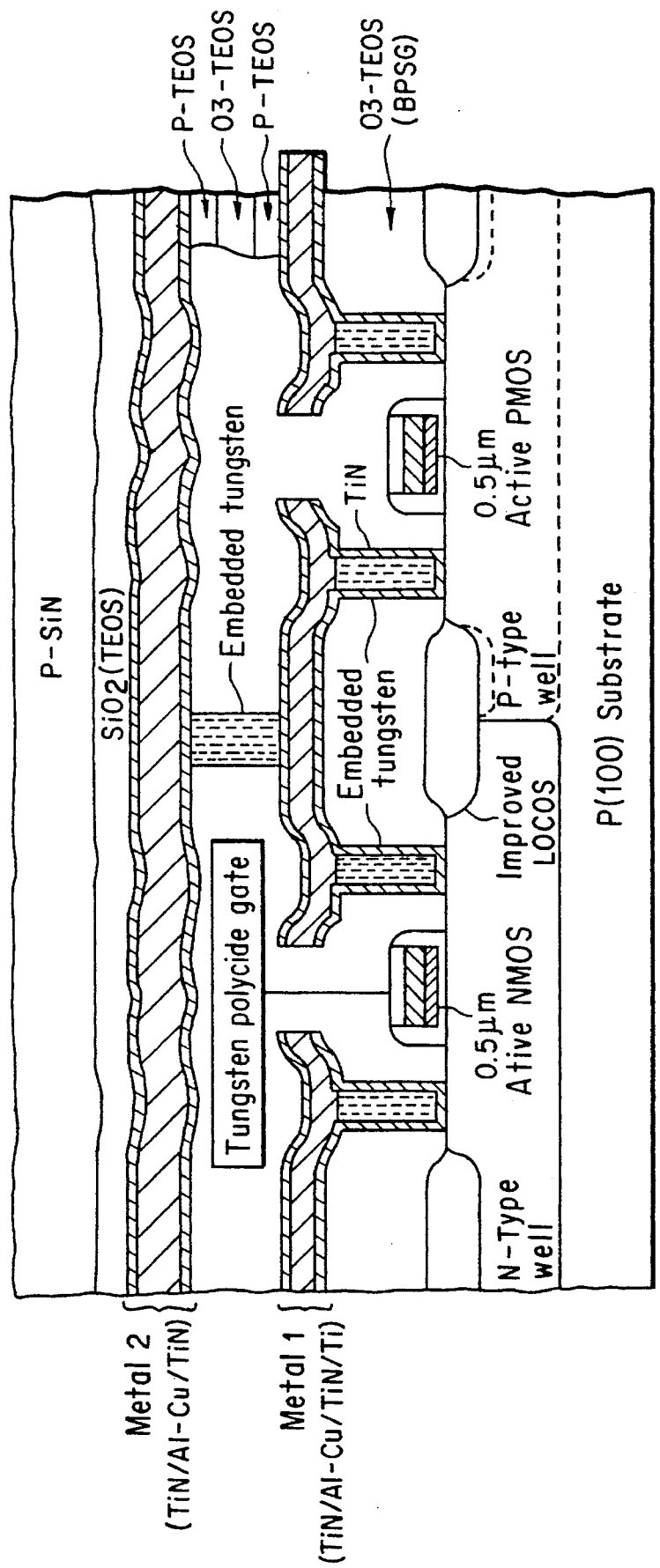
FIG. 3 is a schematic cross sectional view showing a further embodiment of the semiconductor device according to the present invention.

FIG. 3 is a schematic cross sectional view showing another embodiment (metal oxide semiconductor IC; MOSIC) of the semiconductor device according to the present invention. Referring to FIG. 3, there is described an embodiment of production process for a semiconductor device (such as MOS IC) using silicon (Si) in the order of production steps constituting the production process.

More specifically, the above process includes: an element isolation step, e.g., through LOCOS (local oxidation of silicon) on a substrate; an element formation step of forming a gate electrode through the medium of a gate oxide layer, and forming drain and source regions by ion implantation; and a wiring (interconnecting line formation) step of forming a desired wiring film of aluminum (Al) containing an additive element such as copper (Cu). Through these steps, a plurality of chips may finally be formed on a wafer, and an alloying step is conducted at 400° C. The wafer is then scribed so as to provide separate chips, and each of these chips is mounted in a semiconductor package. Thus, a semiconductor device may be produced by a known semiconductor fabrication process.

Then, a semiconductor device thus produced is subjected to a heat treatment (aging) at a predetermined temperature for a predetermined period of time.

Figure 4:
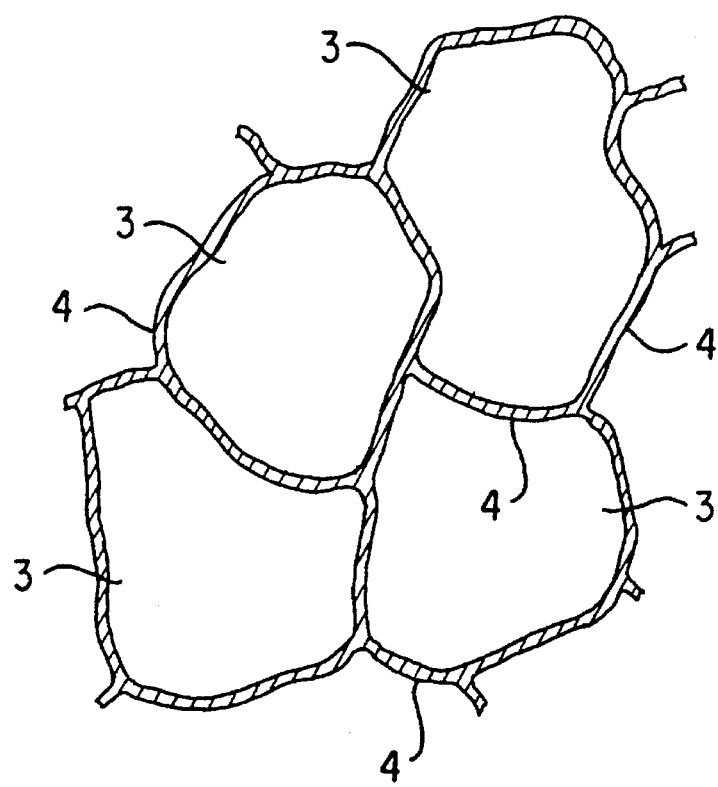
FIG. 4 is a schematic view for illustrating the structure of a major part in an interconnecting line in an embodiment of the present invention.
Figure 5:
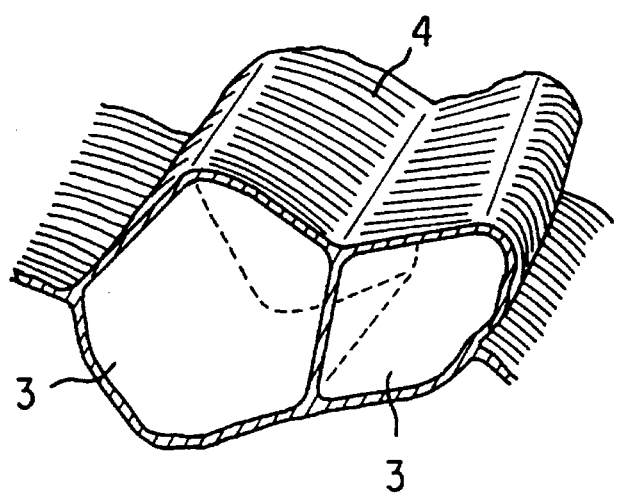
FIG. 5 is a schematic perspective view for further illustrating the structure of a major part in an interconnecting line in an embodiment of the present invention.

When the semiconductor device is thus subjected to the aging treatment, an additive element such as copper (Cu) or an Al alloy containing the additive element (such as Al-Cu alloy) segregates along grain boundaries between aluminum grains 3 of a wiring layer, as shown in a schematic view of FIG. 4. Then, a segregate layer 4 of the additive element or the Al alloy is formed on a face (or plane) of the grains 3, as shown in FIG. 4 and a perspective view of a major part of FIG. 5.

When such a segregate layer 4 is formed, the thus formed segregate layer 4 functions to reduce vibration or diffusion of aluminum grains 3, whereby the electromigration or/and stress migration is reduced. As a result, a semiconductor device improved in lifetime and reliability may be provided.

In the present invention, the above additive element to be added to Al for forming an interconnecting line may preferably comprise Cu, Pd, Mg, So, Ni, Hf, Ti, etc. In view of prevention of electromigration, Cu may particularly preferably be used as the additive element.

In the present invention, an interconnecting line of a semiconductor device is subjected to a heat treatment so as to segregate the above-mentioned additive element in (or at) an Al grain boundary. In the present invention, in view of electromigration resistance, it is preferred that in the interconnecting line after the heat treatment, the additive element such as Cu is distributed in a state such that at least a part of the additive element is substantially invisible by TEM (transmission electron microscope) observation but is detectable or visible by EDX (energy dispersion analysis of X-ray) observation. For such TEM and EDX observation, the following conditions may preferably be employed.

<TEM>

Equipment: JEM 200CX (mfd. by Topcon K.K.)

Acceleration voltage: 200 KV

Magnification: ×10,000

<EDX>

Equipment: Kevex EDS System electron beam diameter: 10 nmΦ

With respect to the distribution state of the additive element such as Cu, the following intensity ratio (r) of the additive element may preferably be not less than 1.1, more preferably not less than 1.2 (particularly preferably, not less than 1.4).

Intensity ratio (r)=I(G.B.)/I(I.G.), where I(G.B.) denotes an average EDX intensity of the additive element from an Al grain boundary where there is no visible segregate of the additive element by TEM observation; and I(I.G.) denotes an average EDX intensity of the additive element from an inner site of Al grains.

In the present invention, I(G.B.) may preferably be determined by measuring EDX intensities at randomly selected 4 (four) points of Al grain boundaries and averaging the thus measured intensities. On the other hand, I(I.G.) may preferably be determined by measuring EDX intensities at randomly selected 3 (three) points of inner sites of Al grains and averaging the thus measured intensities.

Now, there is described a state of the formation of the segregate layer 4 on the basis of experimental results as shown in FIG. 6. FIG. 6 shows states of formation of the segregate layer 4 under various conditions of the aging treatment. The experiments were conducted by using semiconductor devices in which a wiring layer was formed in a thickness of 0.9 μm, a width of 1.2 μm and a length of 6 mm by DC magnetron-sputtered aluminum (Al) containing 0.5% copper (Cu, additive element) on a wafer, and a passivation film was formed by deposition of 0.2 μm-thick PSG (phospho-silicate glass ) and 0.8 μm-thick p-SiN (SiN formed by plasma CVD) formed thereon. An electromigration test was conducted with a flow of $7 \times 10^6$ A/cm$^2$ electrical current in the interconnecting line and at an environmental temperature of room temperature. The lifetimes of lines were compared in terms of a period of time to 10% cumulative failure. The term "time to 10% cumulative failure" used herein refers to a period of time counted from a point of time at which the flow of the electrical current is started to a point of time at which 10% by number of lines (among those subjected to the above electrical current) are disconnected in total. In the present invention, for example, 20 lines may be subjected to the above experiment, and disconnection of total two lines may be detected.

Referring to FIG. 6, when no heat treatment (aging) was conducted, copper (Cu) remained in the aluminum grains and a segregate layer of copper or Al-Cu alloy was not formed along the grain boundaries. In this case, the time to 10% cumulative failure was 250 hours.

Next, when aging at 200° C. was conducted for 100 hours, copper (Cu) in the aluminum grains migrated to the grain boundaries and a segregate layer of Cu or Al-Cu alloy was formed along these grain boundaries. In this case, the time to 10% cumulative failure was 550 hours as shown in FIG. 6.

Further, when aging at 250° C. was conducted for 100 hours, copper (Cu) in the aluminum grains migrated to the grain boundaries and a segregate layer of Cu or Al-Cu alloy was formed along the grain boundaries. In this case, the time to 10% cumulative failure was 650 hours as shown in FIG. 6.

On the other hand, when aging at 300° C. was conducted for 100 hours, copper (Cu) in the aluminum grains migrated to the grain boundaries, but no segregate layer of copper was formed along the grain boundaries. Instead, Cu or an Al-Cu alloy was precipitated in the form of a cluster or bulk at intersections of three boundaries (triple points) or in the grains. In such a case wherein no segregate layer was formed along the grain boundaries, the time to 10% cumulative failure was as short as 20 hours as shown in FIG. 6.

As described above, it was experimentally confirmed that the interconnecting lines with the segregate layer 4 (FIG. 4) formed therein had a function to reduce vibration and diffusion of aluminum grains 3, whereby the electromigration or/and stress migration was reduced so as to provide a semiconductor device with improved lifetime and reliability.

According to the above experiments, it was also confirmed that the aging treatment in a temperature range of 150° C. to about 290° C. for about 100 hours was particularly effective.

FIG. 2 is a cross sectional view of another embodiment of a semiconductor integrated circuit according to the present invention. First, referring to FIG. 2, a silicon substrate 1 is provided and a BPSG film 2 is formed on the silicon substrate 1. Then, a metal thin film of an Al alloy containing 0.5% by weight of Cu is deposited on the BPSG film 2 by sputtering. Next, the metal thin film is subjected to photolithography and anisotropic etching to form metal lines 3 (width: 1.2 μm, length: 2.5 mm), thus finishing a wiring step. Subsequently, a passivation film 4 is deposited by a CVD process to cover the metal lines 3 with the passivation film 4, and an alloying step is conducted at 400° C. Finally, the thus processed silicon substrate 1 is subjected to die bonding and packaging to obtain a sample. In order to improve the electromigration resistance of the sample, a heat treatment is conducted so as to segregate an Al-Cu alloy in the metal thin film 3. The heat treatment may be an isothermal storage of the sample at a predetermined storage temperature for a predetermined storage period. That is, aging treatment is conducted.

FIG. 3 is a schematic sectional view showing another sample to be used for the above estimation of electromigration resistance. The following conditions were employed for the fabrication of the sample shown in FIG. 3 (In the following description, temperatures are "temperatures of the substrate").

<BPSG Film Formation>

BPSG (boron-containing phospho-silicate glass):
300° C., normal (atmospheric) pressure+reflowing
(900° C., 30 min.)

<Sputtering>

Equipment: DC magnetron sputter
Deposition temp. (Al): 200° C.
Deposition temp. (Ti): 170° C.
Deposition temp. (TiN): 170° C. (Ti deposition in N$_2$)

<Etching>

Equipment: ECR etcher
Etching gas: Cl$_2$+BCl$_3$
Power: 80 W
Pressure: 8 mTorr

<Passivation Film Formation>

PSG (phospho-silicate glass): 350° C., normal (atmospheric) pressure p-SiN (SiN formed by plasma CVD): 300° C., normal (atmospheric) pressure <Alloying>

(annealing; heat treatment for stabilization of transistor)
Final heat treatment: 400° C., 30 min.

The respective layers constituting the above sample shown in FIG. 3 had the following thickness.

BPSG film: 1 μm
Ground layer: 1000 Å-thick TiN +500 Å-thick Ti

Al-Cu layer: 8000 Å

TiN film: 230 Å (reflection reducing film patterned by photolithography)

Passivation film: 8000 Å-thick p-SiN +2000 Å-thick PSG

Hereinbelow, there are described various conditions of the aging treatment for the sample as shown in FIG. 3, and effects of the aging treatment on electromigration of the sample. Then, while changing the aging temperature as a parameter, an improvement in electromigration resistance was evaluated. FIG. 7 shows times to 10% failure at which 100 hour-aged samples resulted in 10% disconnection or failure.

This electromigration test was conducted with a flow of $7 \times 10^6$ A/cm$^2$ electrical current in the interconnecting line and at an environmental temperature of room temperature (25° C.). The lifetimes of lines were compared in terms of a period of time to 10% cumulative failure as described above. In this test, 20 interconnecting lines were subjected to the above experiment, and disconnection of two lines in total was detected by monitoring the conductivity of each of the 20 lines by means of a semiconductor testing device (trade name: EME-1020 mfd. by Matsusaka System K.K.).

As shown in FIG. 7, it was confirmed that the samples aged in a temperature range of from 200° C. to 280° C. (particularly, from 200° C. to 250° C.) are improved in electromigration failure time (time to failure based on electromigration) as compared with that of the sample kept in the condition of room temperature without aging. From these results, it was confirmed that the electromigration resistance was enhanced by setting the aging temperature in a range of from 100° C. to 290° C. (particularly, from 200° C. to 280° C.).

In view of the results as described hereinabove, it is considered that the Al-Cu alloy cannot segregate sufficiently in the case of aging at a temperature of below 100° C. On the other hand, it is conceivable that since an aging temperature of above 300° C. is relatively high, the Al-Cu alloy is again incorporated in crystal grains by the subsequent rapid cooling.

Figure 8:
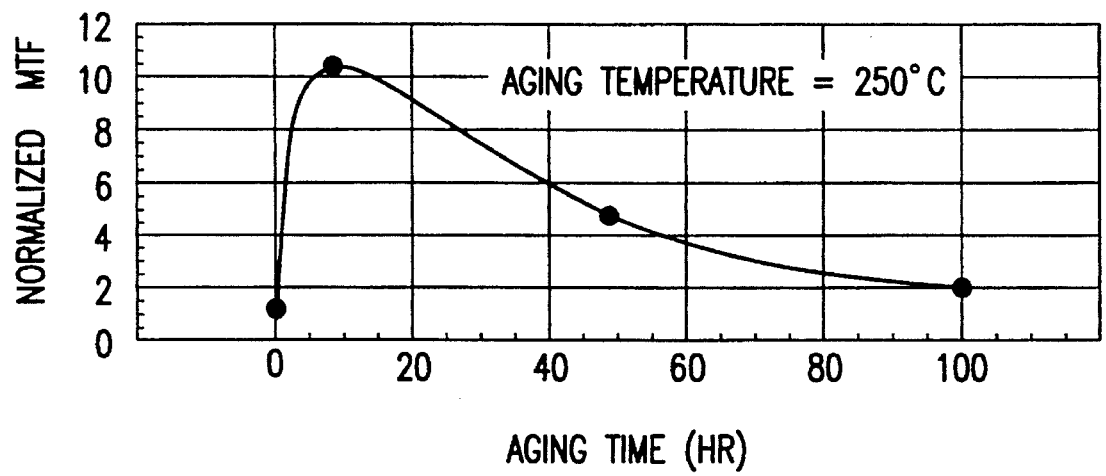
FIG. 8 is a graph showing experimental results obtained by measuring electromigration resistance (MTF) of interconnecting lines while changing an aging period of time.

Further, an increase in electromigration resistance was investigated while changing the aging time. FIG. 8 shows electromigration failure times of samples aged at 250° C. The abscissa represents the aging time and the ordinate represents a mean time to failure (MTF) for each aged sample in terms of a ratio of the MTF of the aged sample to that of a non-aged sample (i.e., normalized MTF). The MTF used herein refers to "time to 50% failure", that is, a period of time counted from a point of time at which the flow of the electrical current was started to a point of time at which 50% by number of lines were disconnected in total.

As shown in FIG. 8, it is confirmed that a sample aged for a period of from 10 to 100 hours can have an electromigration resistance about 2 times greater than that of the non-aged sample; and the increase in the electromigration resistance reaches at a maximum for 10 hour-aged sample.

Figure 9:
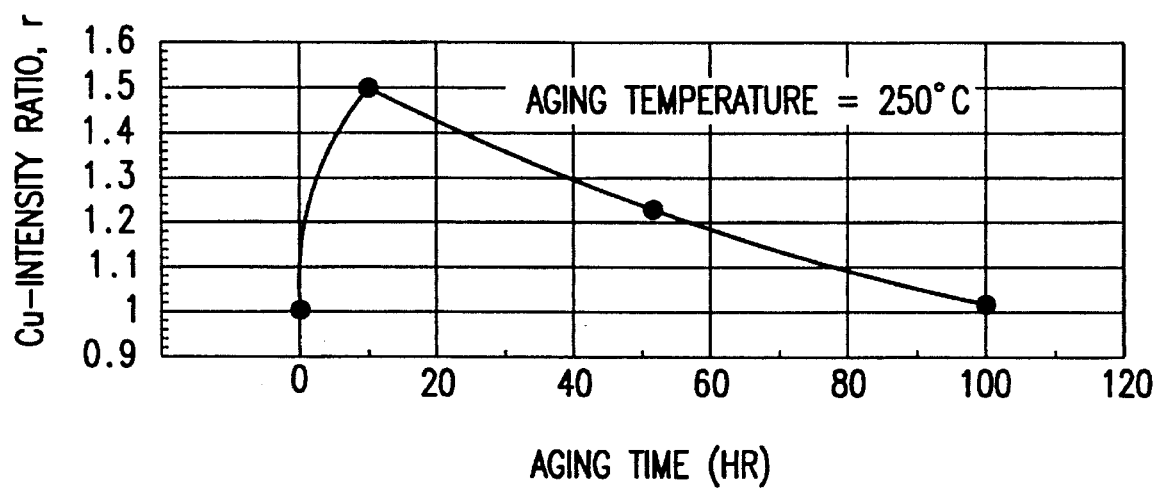
FIG. 9 is a graph showing experimental results obtained by measuring Cu-intensity ratio (r) of interconnecting lines while changing an aging period of time.

FIG. 9 shows Cu (additive element)-intensity ratio (r) of samples aged at 250° C. The abscissa represents the aging time and the ordinate represents the Cu-intensity ratio (measured by EDX) as described above.

As shown in FIG. 9, it is confirmed that a sample aged for a period of from 10 to 80 hours can have a Cu-intensity ratio (r) about 1.1 times greater than that of the non-aged sample; and the increase in the Cu-intensity ratio reaches at a maximum for 10 hour-aged sample. Such a tendency is coincident with that shown in the above FIG. 8.

Figure 10:
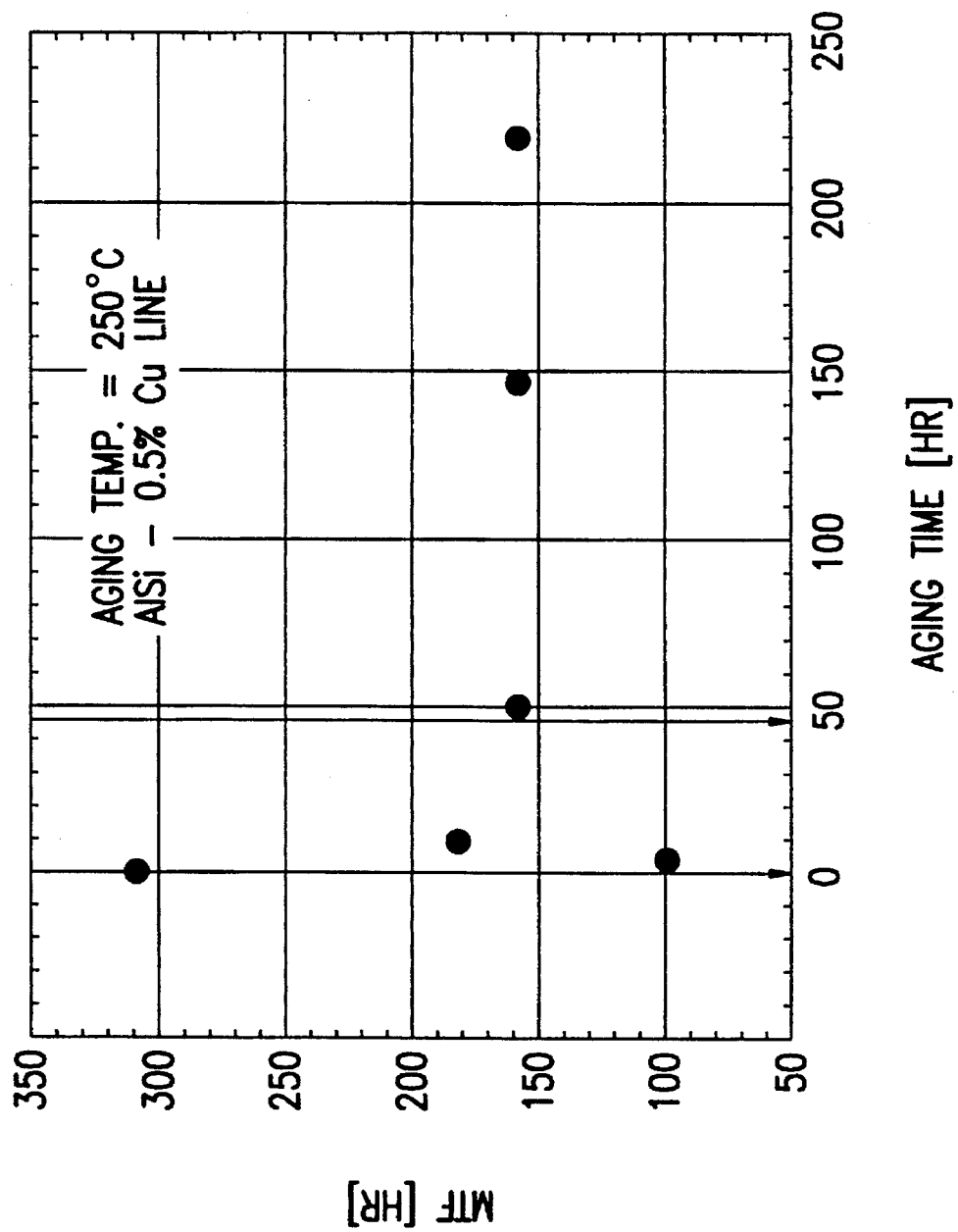
FIG. 10 is a graph showing experimental results obtained by measuring electromigration resistance (MTF) of interconnecting lines of Al alloy thin film of Ai-Si-Cu while changing an aging period of time.

Next, a change in electromigration failure time of lines of Si-containing Al-Cu alloy thin film was investigated. FIG. 10 shows electromigration failure times for 250° C.-aged samples with lines of Al-1% Si-0.5% Cu. The abscissa represents the aging time and the ordinate represent the mean time to failure (MTF) for the aged samples. It is seen from FIG. 10 that immediately after the start of aging, the failure time drops from the initial value of 310 hours to 100 hours which is about one third of the initial value. This may indicate that Si having a diffusion rate higher than that of Cu is segregated in Al grain boundaries but no Cu is segregated yet. Further, after 10 hours from the start of aging, the failure time recovers up to 180 hours which is about a half of the initial value. Then, the failure time remains stable at about 160 hours for the aging time up to 220 hours. This result may mean that the heat treatment for segregating Cu in the presence of a relatively large amount of Si simply results in shortening of the electromigration failure time. In view of these results, it is considered that in the case of an Al alloy thin film containing a relatively large amount of Si, Si grains preliminarily segregate in Al grain boundaries and a local increase of current density is caused on the basis of an effective reduction in cross sectional area of the line, whereby the electromigration failure time is shortened.

Accordingly, it is preferred that Si should be kept at least not to segregate or precipitate during the heat treatment for segregating Cu in lines of an Si-containing Al-Cu alloy thin film. In view of this, in the present invention, the Al alloy constituting an interconnecting line may preferably contain substantially no Si. More specifically, the Si content in the Al alloy may preferably be 0.25 wt. % or below, more preferably 0.20 wt. % or below.

Figure 11:
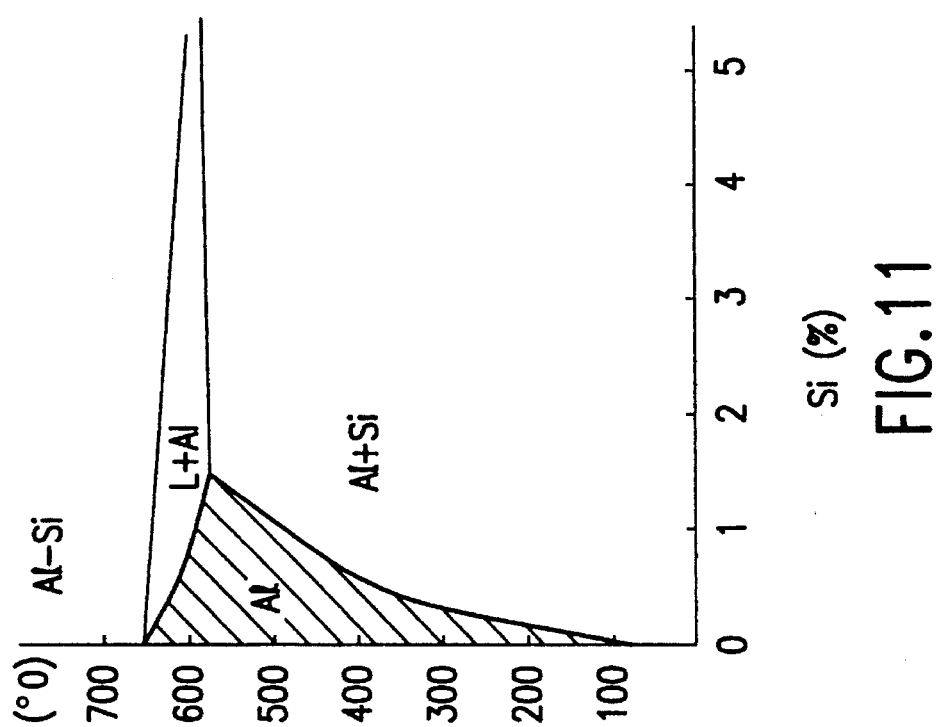
FIG. 11 is an example of Al-Si alloy phase diagram.

Further explanation is given with reference to an Ai-Si phase diagram in FIG. 11. The Al portion or phase (hatched portion) shown in FIG. 11 is a range where Si can be dissolved in Al crystal grains, and a boundary line between the Al portion and the (Ai+Si) portion is a solid solubility (or solvus) of Si with respect to Al. That is, Si does not segregate or precipitate in Al grain boundaries under a condition within the hatched portion surrounded by the solid solubility line, even when the interconnecting line comprising a thin film of an Si-containing Al-Cu alloy is subjected to heat treatment for the purpose of segregating Cu. Accordingly, in the present invention, the Si content in the Al alloy may preferably be not more than the solid solubility of Si to Al at a temperature at which heat treatment is conducted for the purpose of segregating Cu.

Figure 12:
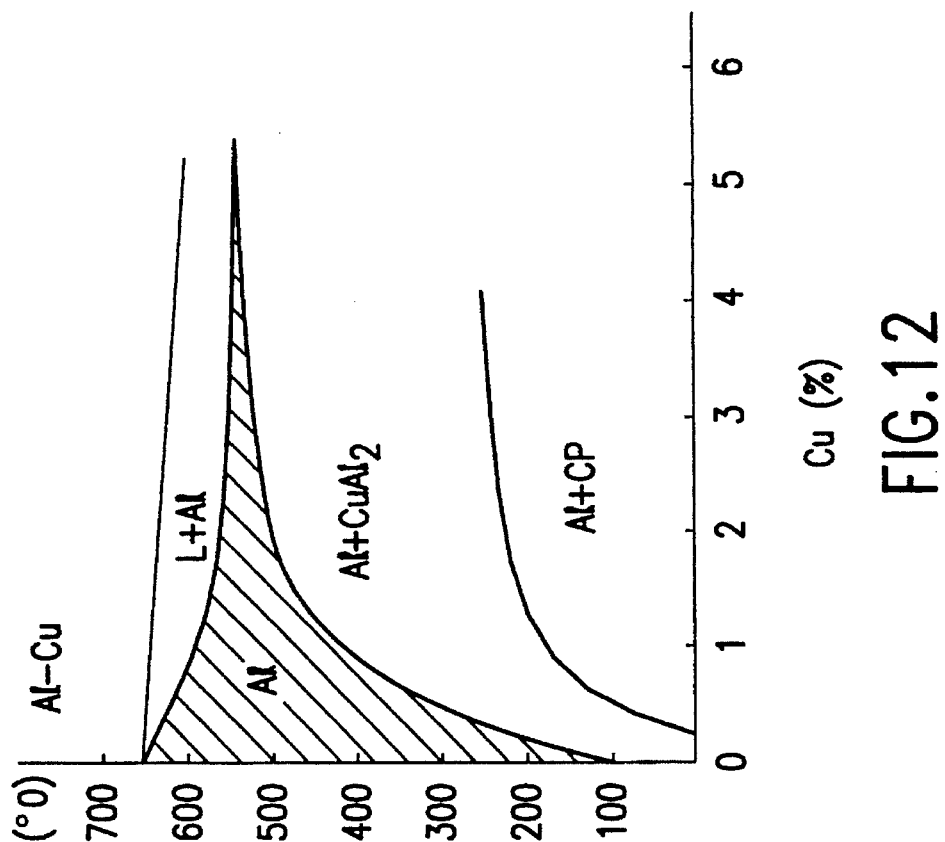
FIG. 12 is an example of Al-Cu alloy phase diagram.

Similarly, explanation is given with reference to an Al-Cu phase diagram in FIG. 12. The Al portion or phase (hatched portion) shown in FIG. 12 is a range where Cu can be dissolved in Al crystal grains, and a boundary line between the Al portion and the (Al+CuAl$_2$)portion is a solid solubility (or solvus) of Cu with respect to Al. That is, CuAl$_2$ as an Al-Cu alloy does not segregate or precipitate under a condition within the hatched portion surrounded by the solid solubility line shown in FIG. 12.

The present invention is not limited to the above embodiments. In consideration of the above description, the electromigration failure time may be improved by segregating an Al-Cu alloy. In the present invention, the wiring metal may preferably comprise an Al alloy containing Cu in an amount of from about 0.1 to 1 wt. % or more. In other words, the Cu content in an Al alloy (i.e., 100×Cu/(Al+Cu)) constituting an interconnecting line may preferably be 0.1 to 4 wt. %, more preferably 0.1 to 2 wt. %, particularly preferably 0.4 to 0.6 wt. %.

Further, the aging time may preferably be 10 hours or more. However, there may be a case wherein aging of 5 hours is sufficient. Further, the method or manner by which the aging treatment is to be conducted is not particularly restricted. For example, the aging treatment may be conducted continuously or intermittently. However, in general, it is not desirable to conduct a heat treatment at above 300° C. for a long period of time after the aging treatment.

In other words, in the present invention, the aging time can be changed in accordance with treatment conditions such as aging temperature and additive element (such as Cu) content. In general, the aging time may preferably be about 1 to 500 hours, more preferably 5 to 200 hours, particularly preferably 5 to 100 hours. On the other hand, in general, the aging temperature may preferably be 200° to 290° C., more preferably 200° to 280° C., particularly preferably 200° to 250° C.

When the Cu content is in the range of 0.4 to 0.6 wt. % and the aging temperature is in the range of 200° to 250° C., the aging time may preferably be 5 to 50 hours. When the Cu content is relatively high, the aging temperature may preferably be relatively high, and the aging time may preferably be relatively short. On the other hand, when the Cu content is relatively low, the aging temperature may preferably be relatively low, and the aging time may preferably be relatively long.

Figure 14:
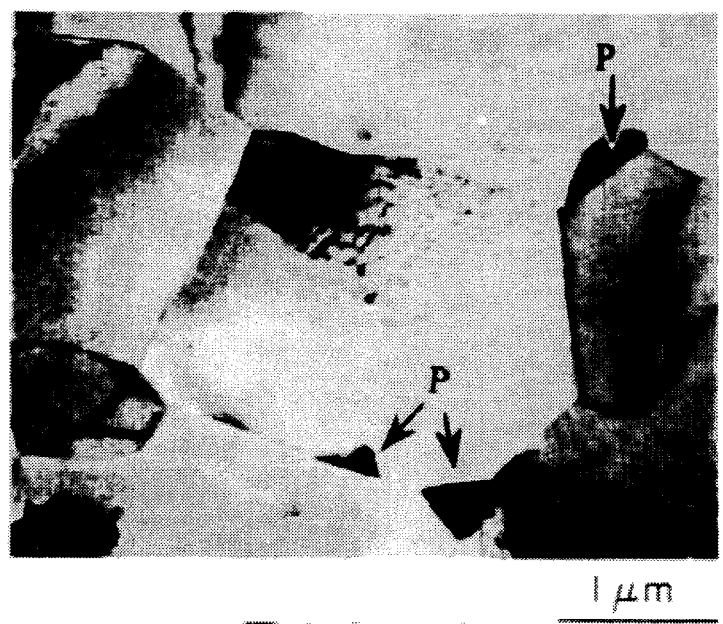
FIG. 14 is a photograph of a typical part of a 10 hour-aged Al-Cu alloy.

FIG. 13 is a typical photograph of TEM image of a non-aged sample (1.0 μm-thick DC magnetron-sputtered Al-Cu film containing 0.5 wt. % of Cu). On the other hand, FIG. 14 is a typical photograph of TEM image of the sample which was subjected to an aging treatment at 250° C. for 10 hours, and FIG. 15 is a typical photograph of TEM image of the sample which was subjected to an aging treatment at 250° C. for 100 hours. In these Figures, precipitates at grain boundaries (denoted by "P" in the photographs) are scarcely observed in the non-aged sample (FIG. 13), but are frequently observed in the aged samples (FIGS. 14 and 15). These precipitates were identified to be $CuAl_2$ by ED (electron diffraction) patterns.

FIG. 16 is an example of TEM map from which EDX signals were detected. The signals were detected on average at 2–4 points, at inner sites of a grain (denoted by 1, 2 and 3 in FIG. 16), at grain boundaries between two grains (denoted by 4, 5, 6, 7 and 8), and at grain boundary triple points (denoted by 9, 10 and 11) for each of samples with different aging times. Large EDX intensities were detected from $CuAl_2$ precipitates visible by TEM (denoted by 8 and 11 in FIG. 16). Also from grain boundaries where no visible precipitate was observed (denoted by 4, 5, 6 and 7), intensities of Cu larger than those from inner sites of grains (denoted by 1, 2 and 3) were detected.

Figures 17A, 17B, 17C:
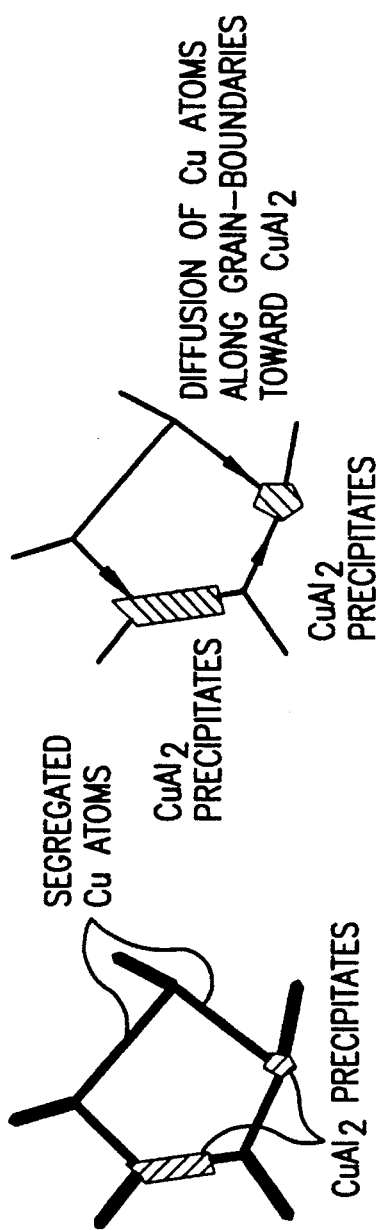
FIGS. 17A, 17B, and 17C are schematic views for illustrating a model for diffusion procedure of Cu atoms during an aging treatment of Cu-Al alloy.
Figure 18:
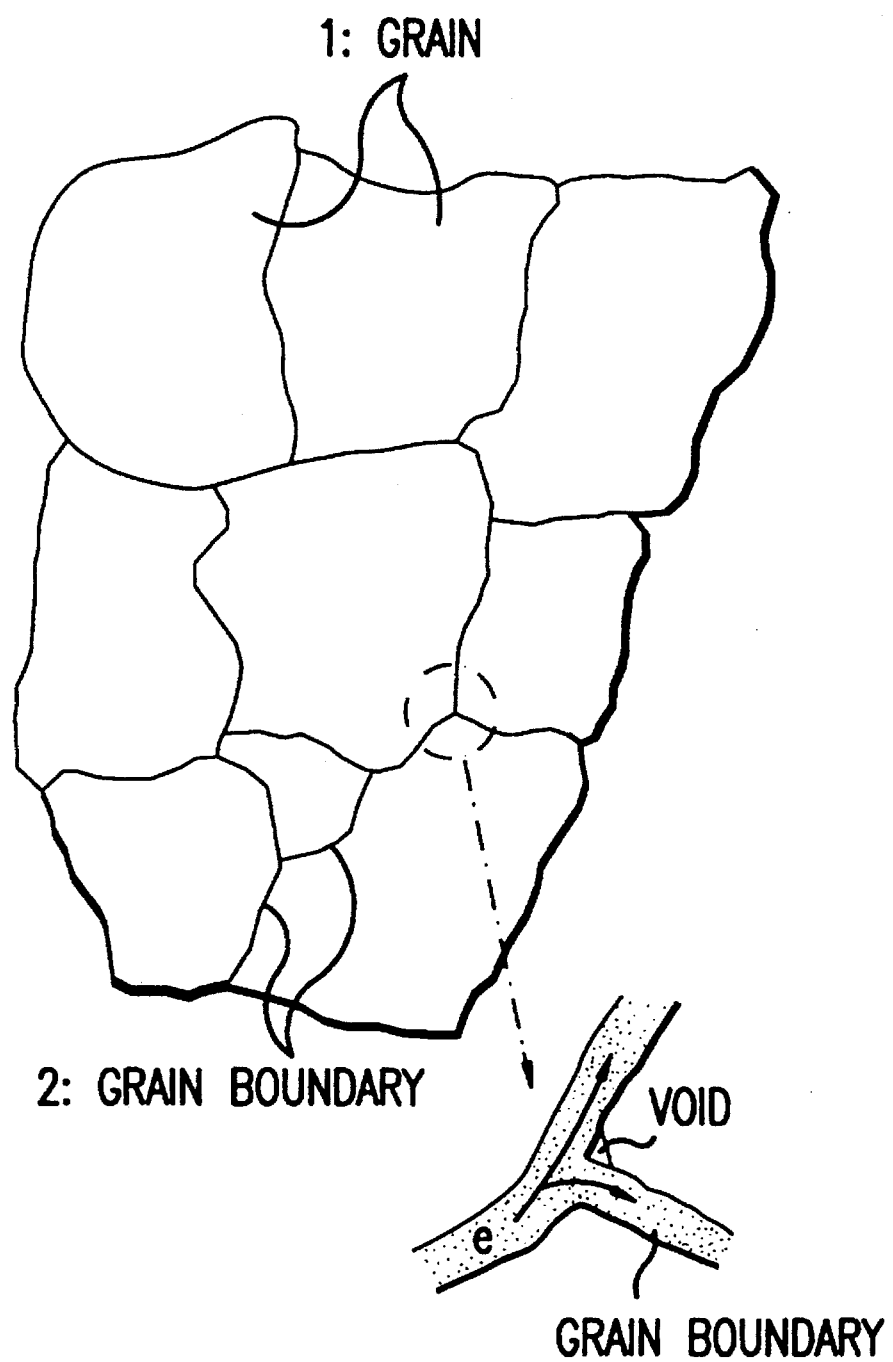
FIG. 18 is a schematic view for illustrating a problem encountered in a conventional technique.

FIGS. 17A, 17B and 17C show summarized models for illustrating a diffusion procedure of Cu atoms during an aging treatment. These models may be confirmed by use of TEM and EDX as described hereinabove.

FIG. 17A shows a model for an Al-Cu sample before aging, wherein Cu atoms are distributed in an Al crystal grain. FIG. 17B shows a model for an Al-Cu sample after 10 hour-aging, wherein Cu atoms are segregated in Al grain boundaries and $CuAl_2$ are precipitated in Al grain boundaries and at a triple point. FIG. 17C shows a model for an Al-Cu sample after 50 hour-aging, wherein Cu atoms are diffused along Al grain boundaries toward the $CuAl_2$ precipitate, and the $CuAl_2$ precipitate becomes larger than that shown in FIG. 17B.

As described hereinabove, according to the present invention, there is provided a semiconductor device which has a film of interconnecting line formed by vapor deposition of aluminum containing a predetermined additive element (such as Cu), and has a structure such that a segregate layer of the additive element is formed along aluminum grain boundaries in the interconnecting line based on an aging treatment after the packaging of a semiconductor device chip. In the present invention, the above segregate layer of the additive element formed along the aluminum grain boundaries functions to reduce vibration and diffusion of the aluminum grains. As a result, according to the present invention, the electromigration or/and stress migration may be reduced, thereby to provide a semiconductor device improved in lifetime and reliability.

In addition, according to the present invention, there is provided a process for producing a semiconductor device which comprises a step of forming an interconnecting line of an Al alloy thin film containing a predetermined additive element (such as Cu), and a step of heat-treating the interconnecting line so as to segregate the additive element. In the present invention, the heat treatment to segregate the additive element is conduced after the formation of the lines of Al alloy containing the additive element, so that a predetermined Al alloy (such as Al-Cu alloy) may be segregated. As a result, the electromigration resistance of the lines may be improved even without increasing the concentration of Cu in the Al alloy thin film.

Further, in a case where the Cu concentration is lower than that employed in the prior art, corrosion of the line is less liable to occur. In addition, in a case where an Al alloy thin film contains substantially no Si, Si is less liable to segregate in Al grain boundaries to form nodules, and therefore the current density in the line is not increased locally. As a result, the resistance of the line is decreased thereby to provide a semiconductor device with high-speed response characteristics.

Many modifications of the present invention may be made without departing from the essential scope thereof. It should be understood that the present invention is not limited to the specific embodiments as described.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A process for producing a semiconductor device, comprising:

forming an interconnecting line of an Al alloy thin film containing an additive element, said interconnecting line containing Si in an amount ranging from greater than zero to not more than solid solubility of Si to Al at a temperature at which a heat treatment is conducted; and subjecting the interconnecting line to said heat treatment so as to segregate the additive element in the interconnecting line.

2. A process for producing a semiconductor device according to claim 1, wherein said additive element is Cu.

3. A process for producing a semiconductor device according to claim 1, wherein said interconnecting line contains Si in an amount of 0.25% by weight or less.

4. A process for producing a semiconductor device according to any of claims 1 to 3, wherein the heat treatment is conducted at a temperature in a range of from 200° C. to 290° C.

5. A process for producing a semiconductor device according to claim 1, wherein the additive element is contained in the interconnecting line in an amount which is sufficient to improve the electromigration resistance of the interconnecting line when segregated at aluminum grain boundaries thereof.

6. A process for producing a semiconductor device according to claim 1, wherein the ratio of mean time to failure of the interconnecting line after the heat treatment to the mean time to failure of the interconnecting line before the heat treatment is two or more.

7. A process for producing a semiconductor device according to claim 1, wherein said subjecting the interconnecting line to a heat treatment does not segregate or precipitate Si in the interconnecting line.

8. A process for producing a semiconductor device, comprising:

forming an interconnecting line of an Al alloy thin film containing an additive element in a semiconductor chip, said interconnecting line containing Si in an amount ranging from greater than zero to not more than solid solubility of Si to Al at a temperature at which a heat treatment is conducted;

mounting the semiconductor chip in a package; and subjecting the interconnecting line of the semiconductor chip mounted in the package to said heat treatment so as to segregate the additive element in the interconnecting line.

9. A process for producing a semiconductor device according to claim 8, wherein the additive element is contained in the interconnecting line in an amount which is sufficient to improve the electromigration resistance of the interconnecting line when segregated at aluminum grain boundaries thereof.

10. A process for producing a semiconductor device according to claim 8, wherein the ratio of mean time to failure of the interconnecting line after the heat treatment to the mean time to failure of the interconnecting line before the heat treatment is two or more.

* * * * *